(12) United States Patent
Huang

(10) Patent No.: US 7,057,918 B2
(45) Date of Patent: Jun. 6, 2006

(54) MEMORY UNIT AND MEMORY MODULE USING THE SAME

(75) Inventor: Cheng-Yen Huang, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 170 days.

(21) Appl. No.: 10/791,341

(22) Filed: Mar. 1, 2004

(65) Prior Publication Data

US 2005/0190592 A1 Sep. 1, 2005

(51) Int. Cl.
*G11C 11/00* (2006.01)
(52) U.S. Cl. .................. 365/154; 711/135; 365/218
(58) Field of Classification Search ............... 365/154, 365/218; 711/135
See application file for complete search history.

(56) References Cited

U.S. PATENT DOCUMENTS

| | | | | |
|---|---|---|---|---|
| 4,567,578 A | * | 1/1986 | Cohen et al. | 365/189.04 |
| 5,010,518 A | * | 4/1991 | Toda | 365/145 |
| 5,450,353 A | * | 9/1995 | Koike | 365/154 |
| 5,845,325 A | * | 12/1998 | Loo et al. | 711/135 |

* cited by examiner

Primary Examiner—Tuan T. Nguyen
Assistant Examiner—Eric J. Wendler
(74) Attorney, Agent, or Firm—Winston Hsu

(57) ABSTRACT

A memory unit and memory module using the same. The memory module at least has a first memory region with a plurality of memory units. In each memory unit, first and access transistors each have a first terminal coupled to one bit line pair respectively. A latch node is coupled between second terminals of the first and second access transistor to latch data. An OR gate has a first input terminal coupled to a word line, an output terminal coupled to gates of the first and second access transistor, and a second input terminal. The second input terminals of the OR gates in all memory units are coupled to a flush line. Invalidation information is written to the latch nodes in the memory units from the bit line pair when the flush line is activated during a flush operation.

13 Claims, 6 Drawing Sheets

MEMORY UNIT AND MEMORY MODULE USING THE SAME

BACKGROUND OF THE INVENTION

1. Field of the Invention

The present invention relates to cache memory, and more particularly, the invention relates to a memory unit and a memory module applicable to a cache memory.

2. Description of the Related Art

Cache memory is located functionally between a processor and a main memory. The cache memory is generally faster but smaller than the main memory. The cache memory decreases memory access time by storing copies of portions of the contents of main memory. When a local process performs certain "cachable" operations requiring memory access, the cache memory is checked first to determine if it contains a copy of the information to be accessed. If the cache memory contains a copy of the information to be accessed, the processor performs the operation using the cache memory without accessing main memory. A cache "hit" occurs when the information to be accessed by a cachable operation is stored in the cache memory, and a cache "miss" occurs when the information is not.

A main memory address consists of two fields (not shown) The higher order bits are called the tag field, and the remaining lower order bits are called the index field. As shown in FIG. 1, the cache memory 10 uses a tag memory, separate from data memory, to store the tag fields of the addresses of the main memory contents presently stored. When the processor performs memory access, the index field of the address addresses the tag memory. The output data from the tag memory is then compared bit by bit with the tag field of the main memory address. If the two fields are identical, a hit has occurred, and the corresponding data is supplied to the processor. If the fields are not identical, it is a miss, and main memory must be accessed.

If the contents of the tag memory become corrupted, memory accesses that should miss actually hit. This results in incorrect data supplied to the processor, a dangerous situation. It is common to use a signal parity bit over each byte in the tag memory, whereas, if a bad parity is detected when the tag memory is read, a miss condition is forced.

Conventionally, all information in tag memory is stored by SRAM cells, each having structure as shown in FIG. 2a. During flushing operation, the tag memory is invalidated entry by entry and requires sequential circuits such that the performance of the cache system is affected.

Another conventional method stores the parity bit (control field) of the tag memory using memory banks with new cell structures as shown in FIGS. 2b and 2c, and conventional SRAM cells as shown in FIG. 2a store information of the address field, attribute field and so on. Virtual ground/power terminals (VG/VP) of all cells for the parity bit in the tag memory are connected together to be forced ground/power voltage for flush operations. Although this method requires fewer additional control logic circuits, it requires asynchronous circuits and is poorly compatible with timing analysis. Further, this method has no tolerance for that there cannot be any signal glitch or system noise between the virtual power/ground terminals and the memory units, with which the data stored in the memory units may be unreliable.

SUMMARY OF THE INVENTION

It is therefore an object of the present invention to provide a memory unit with a simple structure to store the parity bit (control field) of the tag memory.

Another objection of the present invention is to provide a memory unit acting as a real synchronous element and is less sensitive to the signal glitch and system noise.

According to the above mentioned object, the present invention provides a memory unit. In the memory unit, a first access transistor and a second access transistor are coupled to a bit line pair. The first access transistor has a first terminal coupled to one bit line pair, and the second access transistor has a first terminal coupled to the other. A latch node is coupled between second terminals of the first access transistor and the second access transistor to latch data. A selection unit has two input terminals coupled to a word line and a flush line, and an output terminal is coupled to gates of the first access transistor and the second assess transistor. Invalidation information is written into the latch node from the bit line pair according to activations of the word line or the flush line.

The present invention also provides a memory module. In the memory module, at least one first memory region has a plurality of memory units. In each memory unit, the first access transistor has a first terminal coupled to one of a bit line pair, and the second access transistor has a first terminal coupled to the other. A latch node is coupled between second terminals of the first access transistor and the second access transistor to latch data. A selection unit has a first input terminal coupled to a word line, an output terminal coupled to gates of the first access transistor and the second assess transistor, and a second input terminal. The second input terminals of the selection units in all memory units are coupled to a flush line. Invalidation information is written into the latch nodes in the memory units from the bit line pair when the flush line is activated during a flush.

BRIEF DESCRIPTION OF THE DRAWINGS

The present invention can be more fully understood by the subsequent detailed description and examples with reference made to the accompanying drawings, wherein.

DETAILED DESCRIPTION OF THE INVENTION

Figure 2A:
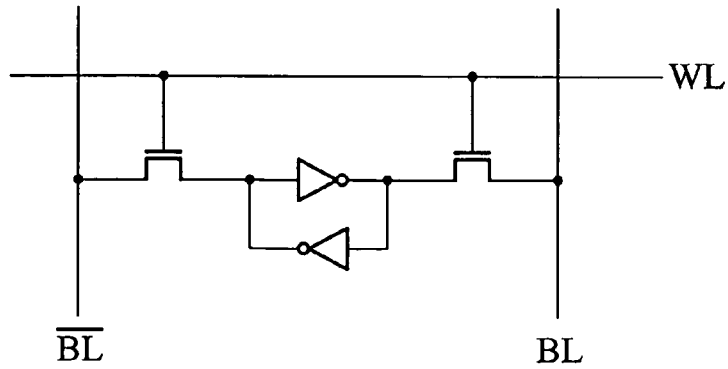
FIG. 2a shows a conventional memory unit.
Figure 3:
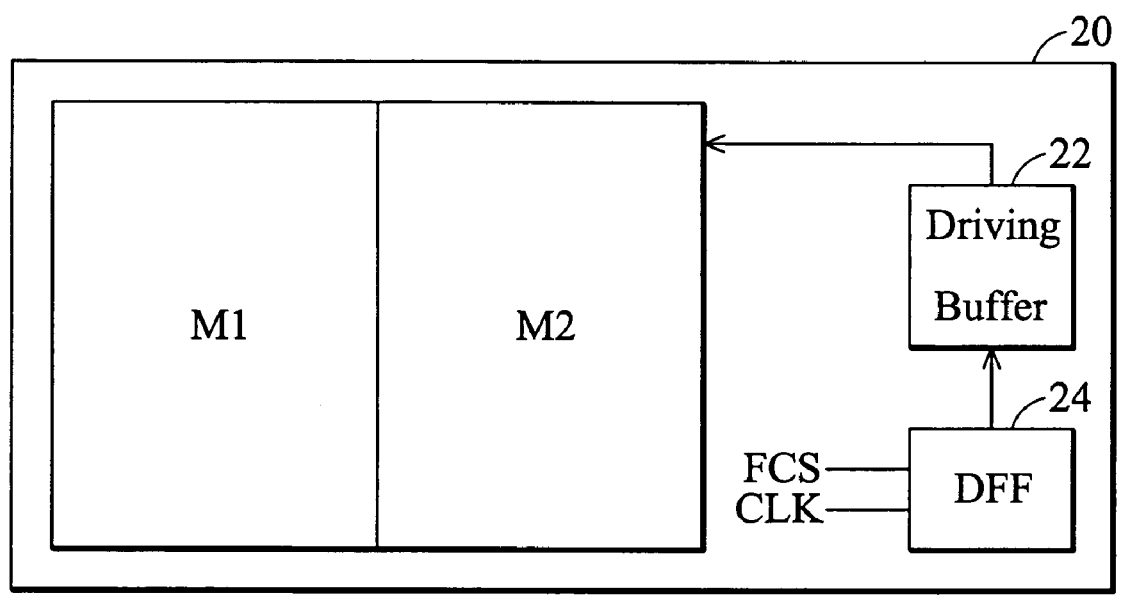
FIG. 3 is a diagram of the memory module according to the present invention.
Figure 4:
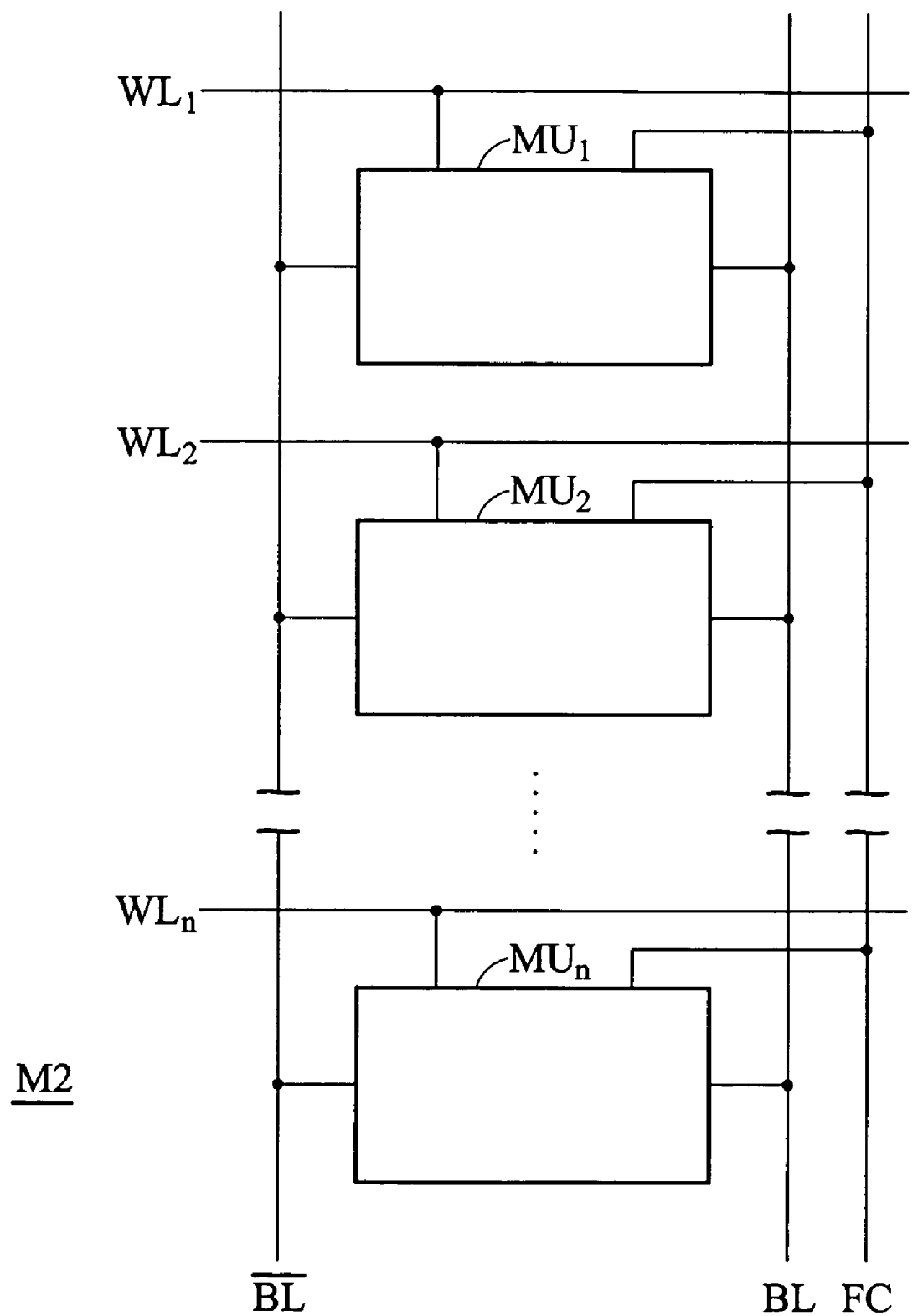
FIG. 4 is a diagram of the memory units in the memory module according to the present invention.

FIG. 3 is a diagram of the memory module 20 according to the present invention. The memory module 20 includes two memory regions M1 and M2, a driving buffer 22, and a D-type Flip-Flop 24. The memory region M1 has a plurality of memory units storing the address field and attribute field in a tag memory. In the memory region M1, all memory units are convention SRAM cells as shown in FIG. 2a. The memory region M2 also includes a plurality of memory units storing entry control bits of the control field in a tag memory. The entry control bits also can be tag validation bits in a cache memory, tag modified/dirty bit in a copy-back/write-back cache memory and the like. FIG. 4 is a diagram of the memory region M2. In the memory region M2, the memory unit MU1 is coupled to the word line WL1, the memory unit MU2 is coupled to the word line WL2 and so on. Further, all memory units MU1~MUn are coupled to a bit line pair (BL and $\overline{BL}$), and a flush line FC. The D-type Flip-Flop (DFF) 24 synchronizes a flush signal FCS by a clock signal CLK. The driver buffer 22 is coupled to the DFF 24 to activate the flush line when receiving the flush signal FCS from the DFF 24. In the embodiment, the driving buffer 22 can include buffers connected in series (not shown).

Figure 5:
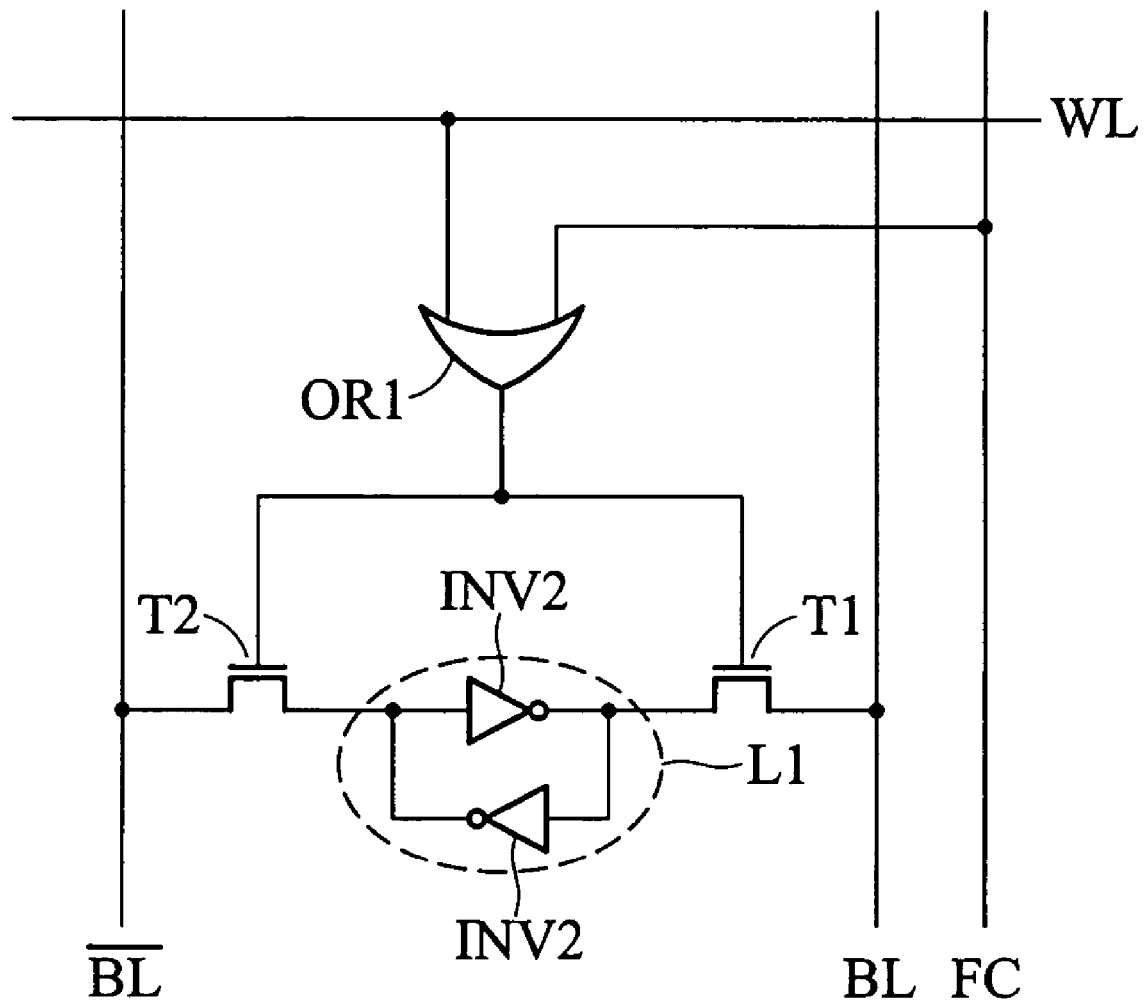
FIG. 5 shows the structure of the memory unit according to the present invention.

The structure of each memory unit (MU1~MUn) is shown in FIG. 5. As shown in FIG. 5, each memory unit has a first access transistor T1, a second access transistor T2, a latch node L1 and a selection unit OR1. In the present invention, the selection unit OR1 can be an OR gate. The selection unit OR1 has two input terminals coupled to a word line WL and the flush line FC, and an output terminal coupled to the gates of the first access transistor T1 and the second access transistor T2. The first access transistor T1 has a first terminal coupled to the bit line $\overline{BL}$, and a second terminal coupled to one end of the latch node L1. The second access transistor T2 has a first terminal coupled to the bit line BL and a second terminal coupled to the other end of the latch node L1. In the present invention, the latch node L1 has a first inverter INV1 and a second inverter INV2. The inverter INV1 has an input terminal coupled to the second terminals of the second access transistors T2, and an output terminal coupled to the second terminal of the first access transistors T1. The inverter INV2 has an input terminal coupled to the second terminals of the first access transistors T1, and an output terminal coupled to the second terminal of the second access transistors T2.

Figure 1:
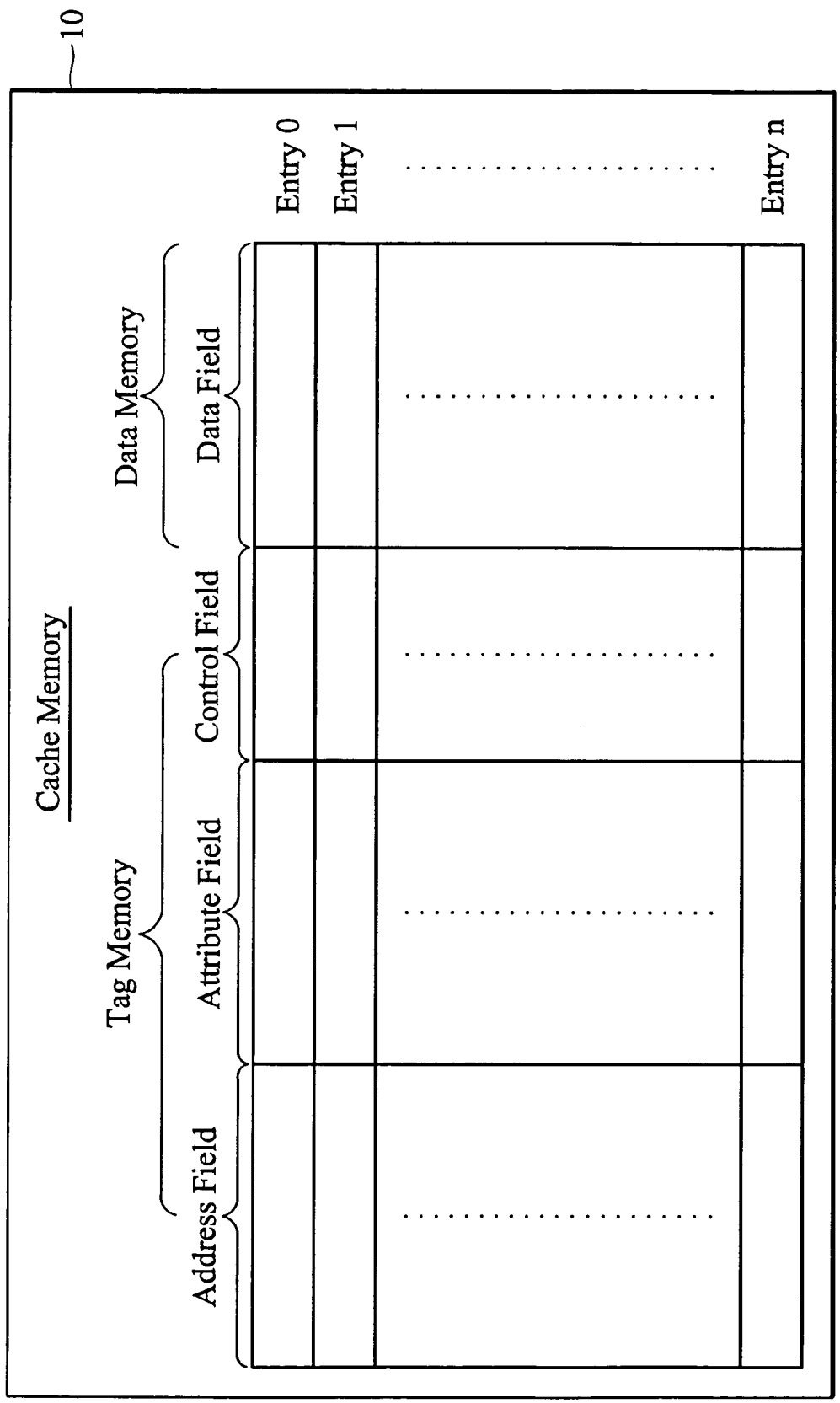
FIG. 1 is a diagram of a cache memory.

During normal operation, the flush line FC is inactive and invalidation information can be written into the latch nodes L1 in the memory unit MU1~MUn from the bit line pair (BL and $\overline{BL}$) according to activation of the corresponding word lines, and the memory unit acts as a conventional memory unit as shown in FIG. 1a. For example, when the word line WL1 is activated, the access transistors T1 and T2 are both turned on such that invalidation information is written to the latch node L1 in the memory unit MU1 from the bit line pair (BL and $\overline{BL}$). Also, when the word line WL2 is activated, the access transistors T1 and T2 are both turned on such that invalidation information is written to the latch node L1 in the memory unit MU2 from the bit line pair (BL and $\overline{BL}$), and so on.

During a flush, all latch nodes L1 in the memory unit MU1~MUn need to be invalidated at once regardless of activation of the word lines WL1~WLn. At this time, the driving buffer actives the flush line FC by the flush control signal FCS from the DFF 24, such that invalidation information is written to the latch nodes L1 in the memory unit MU1~MUn from the bit line pair (BL and $\overline{BL}$) when the flush line FC is activated.

Figure 2B:
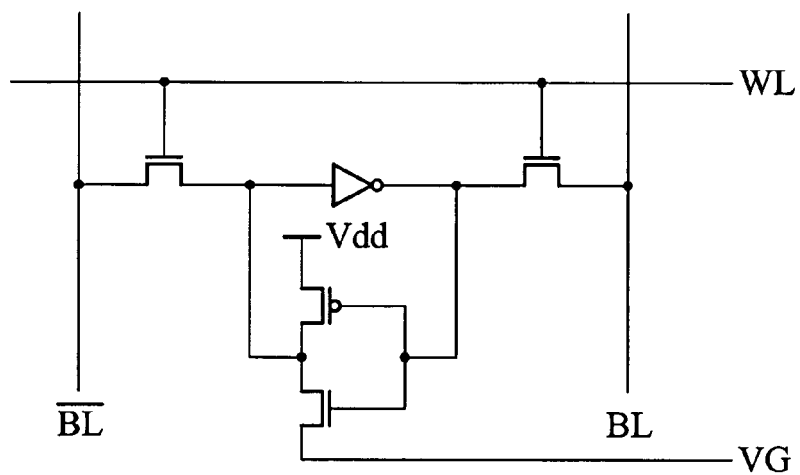
FIG. 2b shows another conventional memory unit.
Figure 2C:
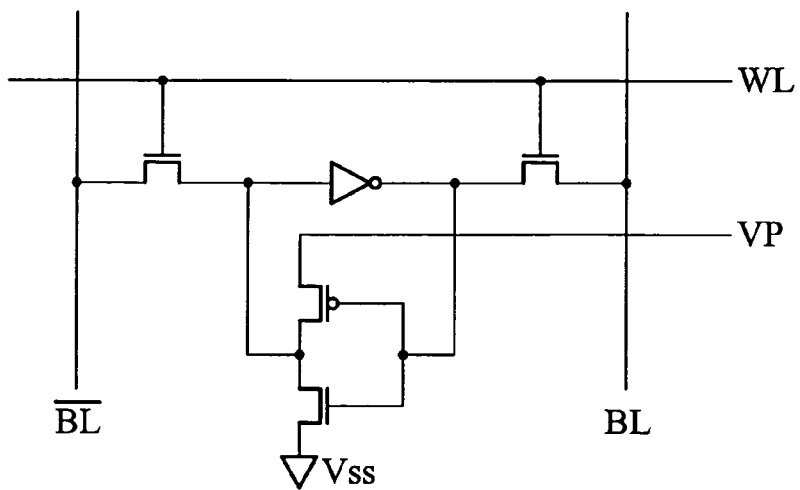
FIG. 2c shows another conventional memory unit.

A conventional method uses memory units, as shown in FIG. 2b and FIG. 2c, to store entry control bits in cache memory, and to change the state of the latch node by controlling the virtual ground/power connected to the source/drain side when the word lines are inactive during flush. Thus, in this conventional method, the memory units are asynchronous elements, and are sensitive to signal glitch, system noise, manufacture process and the like. In the present invention, during flush operation, however, the state of the latch nodes is changed when the word lines and flush lines are activated, such that the memory units in the present invention are real synchronous elements and less sensitive to signal glitch, system noise, manufacture process and so on. Further, the present invention is well suitable to timing analysis, since the state of the latch nodes is changed by controlling the gate side of the access transistor without drain/source side. Moreover, in the present invention, the memory module 20 is applicable to direct-mapping storage, set-associative mapping storage and full-associative mapping storage.

Figure 6:
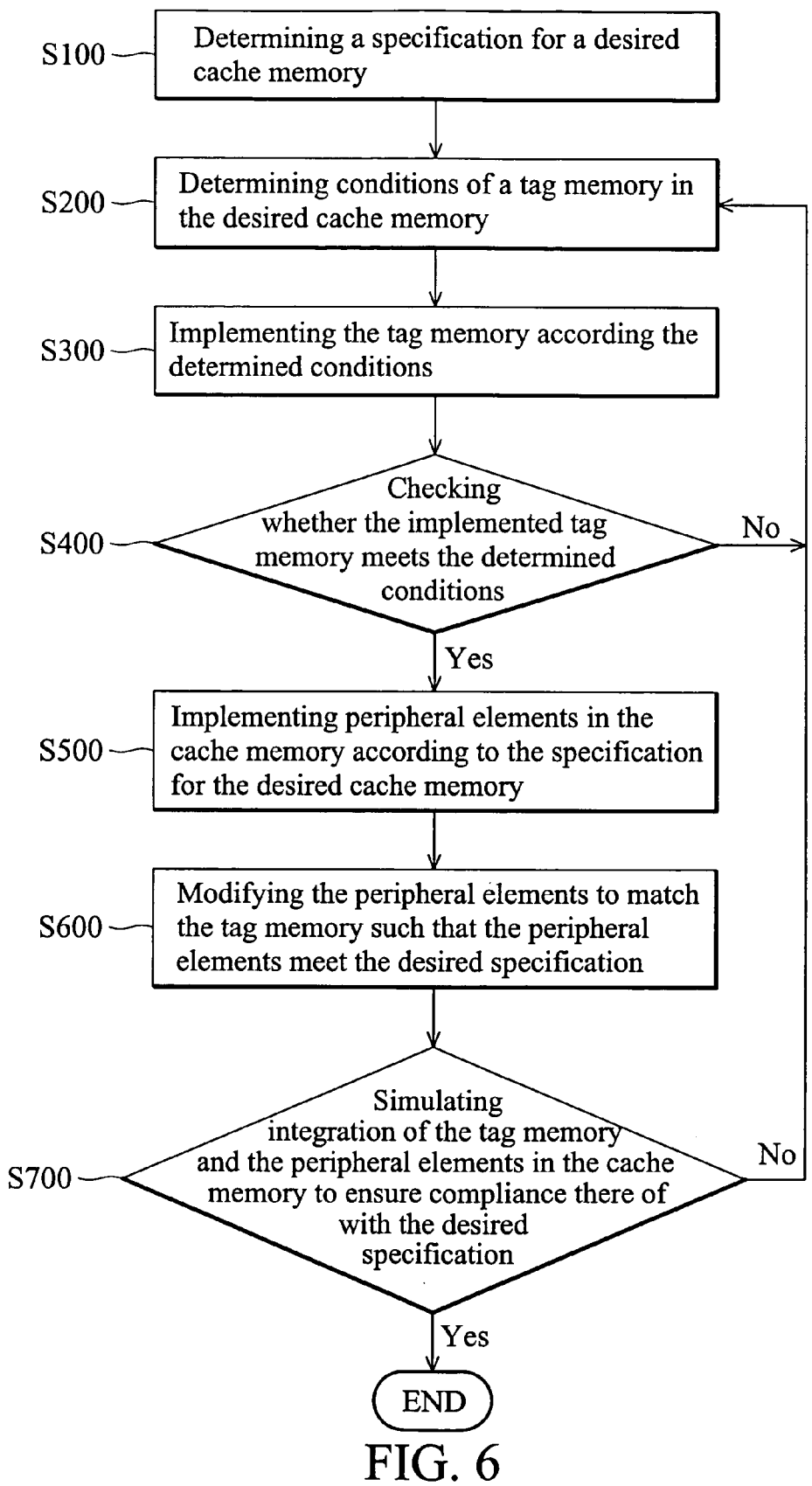
FIG. 6 is a flowchart of the fabrication procedure of a cache memory according to the present invention.

The present invention further provides a fabricating procedure for a cache memory, as shown in FIG. 6. This fabricating procedure for a cache memory is described as follows.

First, in step S100, a specification for a desired cache memory is determined. For example, the specification may include entry number requirement, speed requirement, performance requirement and the like. Next, in step S200, conditions of a tag memory in the desired cache memory is determined. In this case, the conditions include at least the size and flush cycle time of the tag memory and the like. In step 300, the tag memory is then implemented as an IP module or an object according to the conditions determined in step S200. The tag memory implemented to store entry control bits of the control field in a tag memory uses a plurality of memory units with structure as shown in FIG. 5. The entry control bit can also includes tag validation bits in a cache memory, tag modified/dirty bit in a copy-back/write-back cache memory and the like. The implemented tag memory further stores the address field and attributed field using memory units with the structure shown in FIG. 2a.

Next, in step S400, the implemented tag memory is simulated to check for the conditions determined in step S200. If not, the procedure returns to step S200.

Step S500 is executed if the implemented tag memory meets the conditions determined in step S200. In Step S500, peripheral elements in the cache memory are implemented according to the specification for the desired cache memory. For example, a D-type Flip-Flop and a driving buffer are implemented in the cache memory to provide a flush control signal to the tag memory for flush. In Step S600, the peripheral elements are then modified to match the tag memory, such that the peripheral elements meet the desired specification. For example, a D-type Flip-Flop and a driving buffer are modified repetitively to provide a flush control signal with the requisite time cycle. Finally, step S700 is executed if the peripheral elements meet the desired specification. In step S700, integration of the tag memory and the peripheral elements in the cache memory is simulated to ensure that integration of the tag memory and the peripheral elements meets the desired specification. If not, this procedure returns to step S200. If so, the cache memory is complete with the desired specification.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory unit, comprising:
   first and second access transistors coupled to a bit line pair, wherein the first access transistor comprises a first terminal coupled to one bit line pair, and the second access transistor comprises a first terminal coupled to the other;

a latch node coupled between second terminals of the first access transistor and the second access transistor to latch data; and a selection unit having two input terminals coupled to a word line and a flush line, and an output terminal coupled to gates of the first access transistor and the second assess transistor, wherein predetermined information is written to the latch node from the bit line pair according to activations of the word line or the flush line.

2. The memory unit as claimed in claim 1, wherein the selection unit is an OR gate with two terminals coupled to the word line and the flush line respectively and an output terminal coupled to the gates of the first access transistor and the second access transistor.

3. The memory unit as claimed in claim 1, wherein the latch node comprises a first inverter and a second inverter, the first inverter comprises an input terminal coupled to the second terminal of the second access transistor and an output terminal coupled to the second terminal of the first access transistor, and the second inverter comprises an input terminal coupled to the output terminal of the first inverter and an output coupled to the input terminal of the first inverter.

4. The memory unit as claimed in claim 1, wherein when the flush line is activated during a flush operation, the first access transistor and the second access transistor are turned on, such that the predetermined information is written into the latch from the bit line pair.

5. A memory module, comprising:

at least one first memory region comprising a plurality of memory units, each memory unit comprising:

first and second access transistors coupled to a bit line pair, wherein the first access transistor includes a first terminal coupled to one of the bit line pair, and the second access transistor includes a first terminal coupled to the other;

a latch node coupled between second terminals of the first access transistor and the second access transistor to latch data; and a selection unit including a first input terminal coupled to a word line, an output terminal coupled to gates of the first access transistor and the second assess transistor, and a second input terminal;

wherein the second input terminals of the selection units in all memory units are coupled to a flush line, and invalidation information is written into the latch nodes in the memory units from the bit line pair when the flush line is activated during a flush operation.

6. The memory module as claimed in claim 5, wherein predetermined information is written to latch node of one of the memory units from tile bit line pair when a corresponding word line is activated during a normal operation.

7. The memory module as claimed in claim 5, wherein the selection unit is an OR gate comprising two input terminal coupled to a corresponding word line and the flush line, and an output terminal coupled to the gate of the first access transistor and the second access transistor.

8. The memory module as claimed in claim 5, wherein when the flush line is activated during the flush operation, the first access transistor and the second access transistor are turned on, such that the invalidation information is written to the latch nodes in the first and second memory units from the bit line pair.

9. The memory module as claimed in claim 5, wherein the latch node comprises a first inverter and a second inverter, the first inverter comprises an input terminal coupled to a the second terminal of the second access transistor and an output terminal coupled to the second terminal of the first access transistor, and the second inverter comprises an input terminal coupled to the output terminal of the first inverter and an output coupled to the input terminal of the first inverter.

10. The memory module as claimed in claim 5, further comprising:

a D-type Flip-Flop (DFF) receiving and synchronizing a flush signal; and a driving buffer coupled to the DFF to activate the flush line according to the flush signal from the DFF.

11. A fabricating procedure for a cache memory, comprising:

determining conditions for a tag memory in the cache memory according to a desired specification of the cache memory;

implementing the tag memory as a memory module according to determined conditions, wherein tag memory comprises a plurality of memory units, each comprising:

first and second access transistors coupled to a bit line pair, wherein the first access transistor comprises a first terminal coupled to one bit line pair, and the second access transistor comprises a first terminal coupled to the other;

a latch node coupled between second terminals of the first access transistor and the second access transistor to latch data; and an OR gate comprising two input terminals coupled to a word line and a flush line, and an output terminal coupled to gates of the first access transistor and the second assess transistor, wherein invalidation information is written to the all latch nodes in the memory units from the bit line pair according to activation of the flush line;

checking whether the implemented tag memory meets the determined conditions;

implementing peripheral elements in the cache memory according to the desired specification of the cache memory;

modifying the peripheral elements to match the tag memory such tat the peripheral elements meet the desired specification; and simulating integration of the tag memory and the peripheral elements in the cache memory to ensure compliance thereof with the desired specification.

12. The fabricating procedure as claimed in claim 11, wherein the conditions comprise the size and the flush cycle time of the tag memory.

13. The fabricating procedure as claimed in claim 11, wherein the desired specification comprises a number of entries, a desired speed and desired performance for the cache memory.

* * * * *